Figure 1:
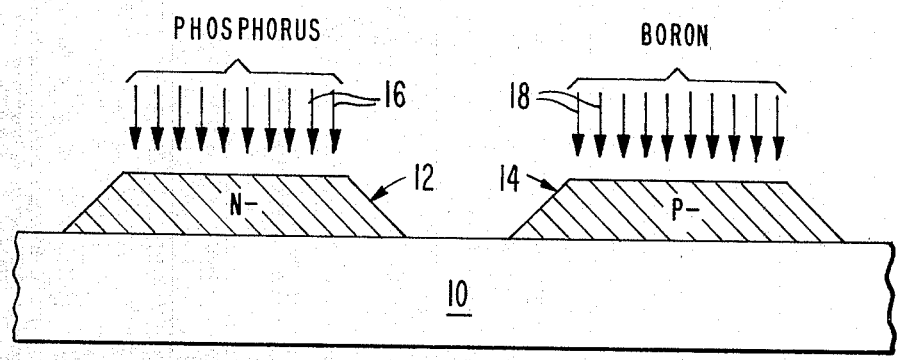

United States Patent [19]

Tanguay et al.

[11] 4,333,099
[45] Jun. 1, 1982

[54] USE OF SILICIDE TO BRIDGE UNWANTED POLYCRYSTALLINE SILICON P-N JUNCTION

[75] Inventors: Donald J. Tanguay, Hightstown; Charles E. Weitzel, Plainsboro, both of N.J.

[73] Assignee: RCA Corporation, New York, N.Y.

[21] Appl. No.: 118,089

[22] Filed: Feb. 4, 1980

Related U.S. Application Data

[63] Continuation of Ser. No. 881,255, Feb. 27, 1978, abandoned.

[51] Int. Cl.$^3$ ............... H01L 29/04; H01L 23/48
[52] U.S. Cl. ............................. 357/67; 357/23; 357/42; 357/59; 357/86
[58] Field of Search ............... 357/23, 42, 15, 67, 357/86, 59

[56] References Cited

U.S. PATENT DOCUMENTS

| | | | |
|---|---|---|---|
| 3,617,824 | 11/1971 | Shinoda et al. | 357/23 |
| 3,653,120 | 4/1972 | Sirrine et al. | 357/67 |
| 3,658,586 | 4/1972 | Wang | 357/23 |
| 3,881,971 | 5/1975 | Greer et al. | 357/67 |
| 4,012,762 | 3/1977 | Abe et al. | 357/42 |
| 4,041,518 | 8/1977 | Shimizu et al. | 357/23 |
| 4,141,022 | 2/1979 | Sigg et al. | 357/67 |

FOREIGN PATENT DOCUMENTS 52-2166   1/1977   Japan ............... 357/59

Primary Examiner—Joseph E. Clawson, Jr.
Attorney, Agent, or Firm—Birgit E. Morris; Donald S. Cohen; Lawrence P. Benjamin

[57] ABSTRACT

Polysilicon lines are utilized for interconnecting the various elements of CMOS devices. The polysilicon lines are doped with whatever dopant conveniently suits the processing step, to form an undesired PN junction. The junction is electrically short-circuited, preferably by a polysilicided section extending across the junction.

10 Claims, 10 Drawing Figures

USE OF SILICIDE TO BRIDGE UNWANTED POLYCRYSTALLINE SILICON P-N JUNCTION

This is a continuation of application Ser. No. 881,255, filed Feb. 27, 1978, now abandoned.

This invention relates in general to integrated circuits and more particularly to the formation of buried contacts for integrated CMOS devices.

In an article entitled "Beam-Lead Technology" by M. P. Lepselter which appeared in the Bell System Journal, Vol. XLV, No. 2, February 1966, a process was described for fabricating beam-lead transistors where the leads severe both a structural and electrical function. The process includes the formation of a platinum silicide ohmic contact and the subsequent formation of a lead consisting of sputtered titanium and platinum layers followed by electroformed gold.

However, as the state of the integrated circuit art progressed, to achieve higher packing densities and reduced manufacturing costs, it became obvious that the process proposed in the article would be unacceptable since the leads occupied excessive chip geography and the added step of sputtering the titanium and platinum layers as well as electroforming the gold raised the costs beyond acceptable limits.

As an alternative to the use of elemental metallic leads of the early prior art, one current technique for producing interconnecting leads, necessary in high density integrated circuits, involves the use of doped polysilicon. In addition, to achieve still higher packing densities in integrated circuit devices, buried contacts have also found wide use. When used in NMOS technology, few difficulties are encountered using the doped polysilicon technique since both the polysilicon leads and the bulk silicon are both doped with n-type impurities. However, when processing CMOS devices, where both n-channel and p-channel devices are used, there are no satisfactory prior art methods of interconnecting the devices with a doped buried contact using the prior art NMOS technique without encountering the formation of an objectionable PN junction. This is due to the fact that regardless of the doping of the polysilicon line, one end of the line is connected to an n-channel device while the other end terminates at a p-channel device. For example, if an n-doped polysilicon line were used an N-P junction would be formed where the line terminated at the p-channel device. Similarly, when using a p-doped polysilicon line as the interconnection between a p-channel and an n-channel device, a P-N junction would be formed at the n-channel device.

In accordance with the invention herein described, these difficulties are overcome by using a polysilicon line, doping the line with whatever type dopant conveniently suits the processing step, allowing the undesired junction to be formed and thereafter providing the junction with an electrical short circuit, preferably in the form of a polysilicided section, which extends across the junction.

Figure 2:
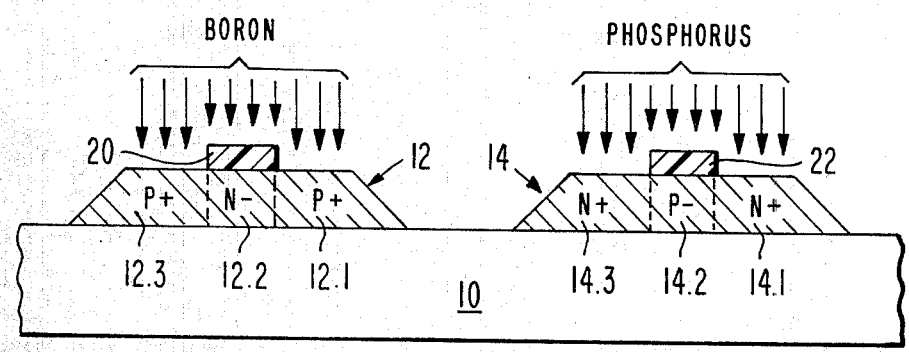
Figure 3:
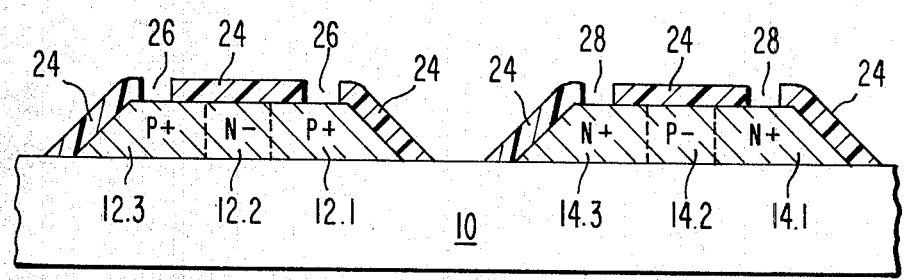

In the drawings:

FIGS. 1-3 are progressive steps in the formation of a silicon-on-sapphire CMOS semiconductor device common to the various embodiments hereinafter presented; and FIGS. 4-7 are the various embodiments of our novel device.

While the following exegesis will be presented in terms of using sapphire as an insulative substrate or carrier, we do not wish to be so limited. Those skilled in the art will readily recognize that the generic expression silicon-on-sapphire (SOS) also includes the use of spinel or monocrystalline beryllium oxide.

Referring now to FIG. 1 there is shown the initial processing steps common to the various embodiments of our novel device wherein silicon islands 12 and 14 are co-located on sapphire substrate 10. After islands 12 and 14 are formed, each is then selectively masked (not shown) to first dope one and then the other. In the example shown, island 14 is masked and island 12 is doped with a phosphorus impurity to form an N− type island 12. After island 12 is doped the mask is removed from island 14 and another mask applied to the now doped island 12 after which island 14 is doped with, for example, boron by any of many well known ion implantation or diffusion techniques.

Thereafter, the mask is removed from island 14 and a second selective masking process is carried on, where, for example, island 14 is completely masked while island 12 is provided with a mask 20. Masked island 12 is now subjected to an ion implantation using boron to form P+ regions 12.1 and 12.3 while the N-portion 12.2, located under mask 20 preserves the conductivity type originally implanted therein. At this point, the masks on both islands are removed and island 12 is provided with a mask to completely cover the now implanted area while island 14 is provided with a mask 22 to protect the p-doped area lying under mask 22 in region 14.2. Thereafter, the exposed portion of island 14 is subjected to, for example, a phosphorus ion implantation or diffusion to produce N+ areas 14.1 and 14.3.

Referring now to FIG. 3 it will be seen that after the drain, channel and source regions (12.1, 12.2 and 12.3 respectively) have been formed in island 12 and the corresponding drain, channel and source regions (14.1, 14.2, and 14.3 respectively) of island 14 are formed, any masks present on either of the islands, as a result of the preceding processing steps, are removed and both islands are provided with oxide layers 24. Layers 24 are then suitably masked and contact holes 26 and 28 are opened.

EMBODIMENT I

Figure 4A:
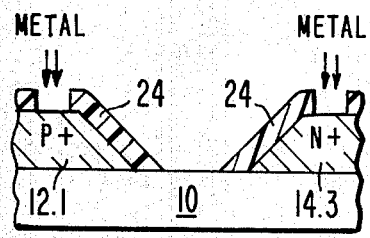
Figure 4B:
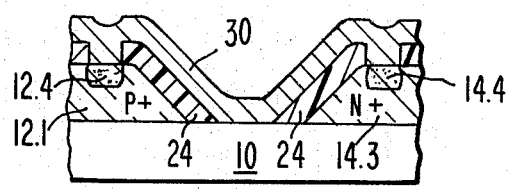

Referring now to FIGS. 4a and 4b here is shown one embodiment of my invention wherein, after contact holes 26 and 28 have been opened in silicon dioxide layers 24, only the exposed portions of drain 12.1 and source 14.3 are subjected to the siliciding step. In this embodiment, as well as the following embodiments platinum silicide is chosen as the ohmic contact material, however, those skilled in the art will readily recognize the fact that palladium titanium zirconium, hafmium, vanadium, niobium, tantalum, chromium, molybdenum, tungsten and nickel may also be used. In this embodiment, the device is maintained at a temperature of about 200° C. and the platinum is sputtered thereon over the entire surface of the device. During a subsequent annealing operation the platinum will react only with the exposed silicon to the exclusion of any reaction with silicon dioxide layer 24. The annealing operation is carried on in an inert atmosphere maintained at a temperature about 700° C. while in the inert atmosphere. The platinum sputtered in the contact holes reacts only with the silicon to form PtSi portions 12.4 and 14.4 which are in the solid phase and which will not ball or creep beyond the edges of the contact holes as would a liquid eutectic. Any platinum that is sputtered onto or is inadvertently deposited on oxide layer 24 is readily removed, using hot, concentrated Aqua Regia. Thereafter, polysilicon line 30 is deposited into contact holes (to contact portions 12.4 and 14.4) and over oxide layers 24 in order to form an ohmic contact with drain 12.1 and source 14.3 respectively. At this point, the reader has the option of doping the polysilicon line 30 with either a P or an N type impurity as no junction will be formed at either silicided portions 12.4 or 14.4. It should be noted that while this embodiment is directed to a situation wherein silicided portions (12.4 and 14.4) have been formed in both drain region 12.1 and source region 14.3, it should now be obvious that, for example, if polysilicon line 30 is doped with a P type impurity then only silicided area 14.4 is necessary since no junction will be formed at the contacting interface between drain 12.1 and polysilicon line 30. The reverse is true if polysilicon line 30 is doped with an N type impurity in which event silicided area 14.4 will be unnecessary.

EMBODIMENT II

Figure 5A:
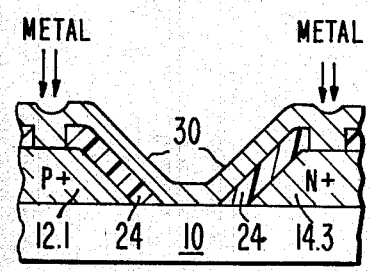
Figure 5B:
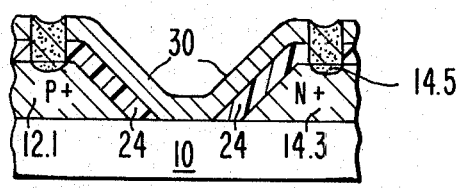

Referring now to FIGS. 5a and 5b, it will be seen that after the contact openings are formed in oxide layers 24, the device is first provided with polysilicon line 30 in order to connect drain 12.1 with source 14.3. Assuming that the interconnecting line 30 is doped with a P type impurity it will be seen that a P-N junction will be formed at the interface of source 14.3 and polysilicon line 30. In accordance with the teachings of our invention, platinum is sputtered on the exposed surface of the polysilicon line 30 and annealed at 700° C. in an inert atmosphere for a sufficient period of time in order to drive the platinum through line 30 into active area 14.3 in order to form silicided portion 14.5. It will also now become obvious in this embodiment, that no harm will be done in the event the entire length of polysilicon line 30 is silicided since the net result would be to reduce the overall resistance thereof. However, after siliciding line 30, or any portion thereof, any junction formed at the interface between polysilicon line 30 and source 14.3 is thus provided with a polysilicided portion 14.5 which serves as a short circuit across the PN junction.

EMBODIMENT III

Figure 6A:
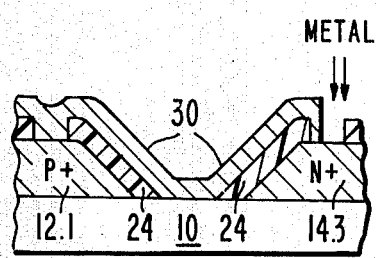
Figure 6B:
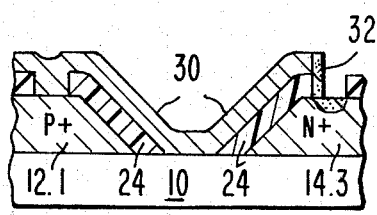

In the embodiment shown in FIGS. 6a and 6b, polysilicon line 30 is first deposited on oxide layer 24 to connect drain 12.1 with source 14.3 and is assumed to be doped with a P type impurity. This embodiment depicts the situation wherein line 30 extends only partially into the contact opening over surface 14.3. Having formed this structure, the platinum is sputtered over the entire device and into the contact hole above source 14.3 and thereafter annealed at about 700° C. in an inert atmosphere, to form silicided portion 32. Since the silicided portion will only form in either silicon or polysilicon and not in silicon dioxide, any portions or oxide layers 24 having platinum sputtered may be easily removed, as previously described, while the formation of silicided portion 32 serves as a short circuit for any junction formed at the interface of p-doped polysilicon line 30 and n-doped drain 14.3.

EMBODIMENT IV

Figure 7:
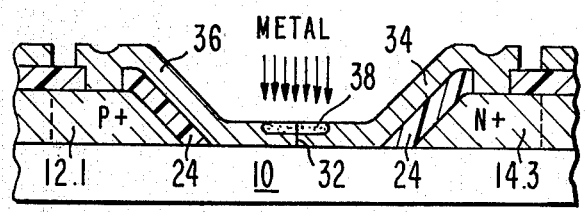

In the embodiment shown in FIG. 7, after the contact openings are provided over drain 12.1 and source 14.3, polysilicon lines 34 and 36 are deposited in order to make an ohmic contact with source 14.3 and drain 12.1 respectively. A mask is provided for line 34, after which line 36 is doped with a p-type impurity. The mask is then removed from line 34 and line 36 is then masked after which polysilicon line 34 is doped with n-type impurity. The new result is that junction 32 is now formed where lines 34 and 36 meet. To dispose of this unwanted junction, the area on both sides of junction 32 is silicided by sputtering platinum over the area of the junction and annealing the sputtered portion at about 700° C. until silicided portion 38 is formed which serves as short circuit for junction 32.

Thus, as shown in each embodiment, the P-N (or N-P) junction that is formed, at either the interface of a p (or n) doped polysilicion line and an n (or p) doped source or drain or at the interface of p and n doped polysilicon lines, is effectively removed by the formation of a low resistance, short circuit silicided area across the junction.

Although we have described a process for forming the silicided area by reacting the described metals with polysilicon, it will now be obvious to those skilled in the art that the silicided area may be formed directly by other well known techniques such as sputtering, evaporating, or the chemical vapor deposition of any one of the named silicides.

What is claimed is:

1. In an integrated complementary MOS circuit having a first MOS device with a pair of first conductivity type active areas and a second MOS device with a pair of second conductivity type active areas; the improvement comprising:

a doped polysilicon line interconnecting one of the first conductivity type areas of the first MOS device with one of the second conductivity type areas of the second MOS device;

the polysilicon line being doped to either the first or second conductiviy type or doped to the first conductivity type over part of its length and doped to the second conductivity type over the remainder of its length, whereby an undesired junction is formed either at the point of contact of the doped polysilicon line and the second conductivity type area of the second MOS device or at the point of contact of the doped polysilicon line with a region of one of the first or second MOS devices or at the point of contact of the two differently doped lengths of the polysilicon line; and means forming a metal silicide at the location of the undesired junction for providing a low resistance conductive path thereacross to eliminate the effect of the undesired junction.

2. The complementary MOS circuit of claim 1, wherein:

the first and second MOS devices are islands of silicon colocated on an insulative substrate; and the substrate is selected from the group consisting of sapphire, spinel and monocrystalline beryllium oxide.

3. The complementary MOS circuit of claim 2 further comprising:

an insulative layer covering both MOS devices;

contact openings in the insulative layer for providing ohmic contact access to the active areas of each MOS device; and the metal silicide is formed only in the accessed active areas of the contact openings whereby when the doped polysilicon line is deposited in the access opening the undesired junction formed at the interface of the active area and the polysilicon layer is short circuited by the metal silicide.

4. The complementary MOS circuit of claim 3 wherein:
the metal silicide is selected from the group consisting of platinum, palladium, titanium, zirconium, hafnium, vanadium, niobium, tantalum, chromium, molybdenum, tungsten and nickel silicides.

5. The complementary MOS circuit of claim 2 further comprising:
and insulative layer covering both MOS devices;
contact openings in the insulative layer for providing the polysilicon line with ohmic contact access to the active areas of each MOS device; and
the metal silicide is formed only in both the portion of the polysilicon line contacting the active area and the portion of the active area contacted by the polysilicon line whereby the undesired junction formed at the interface of the polysilicon line and the active area is short circuited by the metal silicide.

6. The complementary MOS circuit of claim 5, wherein:
the metal silicide is selected from the group consisting of platinum, palladium, titanium, zirconium, hafnium, vanadium, niobium, tantalum, chromium, molybdenum, tungsten and nickel silicides.

7. The complementary MOS circuit of claim 2, further comprising:
an insulative layer covering both MOS devices;
contact openings in the insulative layer for providing the polysilicon line with ohmic contact access to the active area of each MOS device;
the polysilicon line occupying only a portion of the contact opening; and
the metal silicide is formed only in both that portion of the polysilicon line occupying the contact opening and that portion of the active area uncontacted by the polysilicon line whereby the undesired junction formed at the interface of the polysilicon line and the active area is short circuited by the metal silicide.

8. The complementary MOS circuit of claim 7, wherein:
the metal silicide is selected from the group consisting of platinum, palladium, titanium, zirconium, hafnium, vanadium, niobium, tantalum, chromium, molybdenum, tungsten and nickel silicides.

9. The complementary MOS circuit of claim 1, further comprising:
an insulative layer covering both MOS devices;
contact openings in the insulative layer for providing ohmic contact access to the active areas of MOS device;
the doped polysilicon line extending over the insulative layer and making ohmic contact to the active areas of respective MOS devices through the contact openings;
means doping that portion of the polysilicon line in contact with the first conductivity type active area to a first conductivity type;
means doping the remainder of the polysilicon in contact with the second conductivity type active area to a second conductivity type; and
the metal silicide is formed within the junction area of the first and second conductivity type polysilicon lines whereby the undesired junction is short circuited by the metal silicide.

10. The complementary MOS circuit of claim 9 wherein:
the metal silicide is selected from the group consisting of platinum, palladium, titanium, zirconium, hafnium, vanadium, niobium, tantalum, chromium, molybdenum, tungsten and nickel silicides.

* * * * *

UNITED STATES PATENT AND TRADEMARK OFFICE
CERTIFICATE OF CORRECTION

PATENT NO. : 4,333,099

DATED : June 1, 1982

INVENTOR(S) : Donald Joseph Tanguay et al.

It is certified that error appears in the above-identified patent and that said Letters Patent is hereby corrected as shown below:

Column 3, line 58, "or" should be --of--.

Signed and Sealed this

Nineteenth Day of April 1983

[SEAL]

Attest:

GERALD J. MOSSINGHOFF

Attesting Officer

Commissioner of Patents and Trademarks

UNITED STATES PATENT AND TRADEMARK OFFICE
CERTIFICATE OF CORRECTION

PATENT NO. : 4,333,099

DATED : June 1, 1982

INVENTOR(S) : Donald Joseph Tanguay et al.

It is certified that error appears in the above-identified patent and that said Letters Patent is hereby corrected as shown below:

Column 6, line 28, after "formed" insert --only--.

Signed and Sealed this

Twelfth Day of July 1983

[SEAL]

Attest:

GERALD J. MOSSINGHOFF

Attesting Officer

Commissioner of Patents and Trademarks